United States Patent
Skendzic et al.

(10) Patent No.: US 6,529,013 B2
(45) Date of Patent: Mar. 4, 2003

(54) THREE-PHASE VOLTAGE SENSOR WITH ACTIVE CROSSTALK CANCELLATION

(75) Inventors: Veselin Skendzic, Racine, WI (US); E. Frederick Bestel, West Allis, WI (US); Paul N. Stoving, Oak Creek, WI (US); William M. Hurst, Milwaukee, WI (US); Daniel Schreiber, New Berlin, WI (US); Dan G. Margenian, Racine, WI (US); Richard A. Harthun, Eagle, WI (US)

(73) Assignee: McGraw-Edison Company, Houston, TX (US)

( * ) Notice: Subject to any disclaimer, the term of this patent is extended or adjusted under 35 U.S.C. 154(b) by 0 days.

(21) Appl. No.: 09/867,799

(22) Filed: May 31, 2001

(65) Prior Publication Data
US 2002/0180459 A1 Dec. 5, 2002

(51) Int. Cl.[7] .............................................. G01R 27/28
(52) U.S. Cl. ..................................... 324/628; 324/607
(58) Field of Search ............................... 324/628, 620, 324/601, 613, 616, 658, 607

(56) References Cited

U.S. PATENT DOCUMENTS

| | | | |
|---|---|---|---|
| 3,736,440 A | 5/1973 | Nitta et al. ................. | 307/140 |
| 3,988,684 A | 10/1976 | Muller et al. ................ | 323/364 |
| 4,024,356 A * | 5/1977 | Duimelaar ................... | 379/417 |
| 4,074,193 A | 2/1978 | Kohler | |
| 4,124,790 A | 11/1978 | Kumbera et al. | |
| 4,240,031 A | 12/1980 | Siegenthaler ............... | 324/126 |
| 4,241,373 A | 12/1980 | Mara et al. | |
| 4,295,094 A | 10/1981 | Wilreker et al. | |
| 4,360,879 A | 11/1982 | Cameron | |
| 4,456,878 A | 6/1984 | Gamoh | |
| 4,595,988 A | 6/1986 | Chiffert et al. | |
| 4,641,090 A | 2/1987 | Danby | |
| 4,833,401 A | 5/1989 | So | |
| 4,862,074 A | 8/1989 | Weikel | |
| 4,901,005 A | 2/1990 | Shin et al. | |
| 4,924,412 A | 5/1990 | Leydier | |
| 4,933,630 A | 6/1990 | Dupraz | |
| 4,943,765 A | 7/1990 | Dupraz et al. | |
| 4,970,458 A | 11/1990 | Fox | |
| 5,103,111 A | 4/1992 | Tobin et al. | |
| 5,250,894 A | 10/1993 | Bridges et al. | |
| 5,252,913 A | 10/1993 | Falkowski et al. | |
| 5,485,292 A | 1/1996 | Wong et al. | |
| 5,623,201 A | 4/1997 | Park | |
| 5,729,888 A | 3/1998 | Abdelgawad et al. | |
| 5,917,167 A | 6/1999 | Bestel | |
| 6,141,626 A | 10/2000 | Holdsclaw et al. | |
| 6,198,292 B1 * | 3/2001 | Kirk et al. ................... | 324/607 |

FOREIGN PATENT DOCUMENTS

| | | |
|---|---|---|
| DE | 4125856 | 9/1992 |
| EP | 0337265 | 10/1989 |
| GB | 346926 | 4/1931 |
| GB | 2007048 | 5/1979 |
| WO | WO 99/42845 | 8/1999 |

* cited by examiner

Primary Examiner—N. Le
Assistant Examiner—Vincent Q. Nguyen
(74) Attorney, Agent, or Firm—Fish & Richardson P.C.

(57) ABSTRACT

Active crosstalk cancellation in a multi-phase system is achieved using a capacitive voltage divider for each phase in the multi-phase system. A voltage measurement is obtained for the desired phase and each additional phase of the multi-phase system. A product is generated for each additional phase by multiplying each additional phase voltage measurement by a corresponding predetermined constant. The product for each additional phase is subtracted from the voltage measurement of the desired phase.

16 Claims, 11 Drawing Sheets

THREE-PHASE VOLTAGE SENSOR WITH ACTIVE CROSSTALK CANCELLATION

TECHNICAL FIELD

This invention relates to voltage and current sensing.

BACKGROUND

Capacitively-coupled voltage measurement is frequently used to measure the voltage present on a high voltage conductor in high voltage alternating current electric systems. Typically, a high voltage capacitor is connected between the high voltage conductor and the secondary winding, and a load capacitor is connected between the secondary winding and the toroidal ferro-magnetic core. The high voltage capacitor and the load capacitor form a simple capacitive voltage divider from which the voltage of the high voltage conductor may be determined. Voltage measurement is often supplemented with a measurement of current flowing through the high voltage conductor. Typically, a current transformer is used to provide this current measurement by surrounding the high voltage conductor with a ferro-magnetic transformer core around which an insulated secondary winding is wound uniformly.

Although capacitively-coupled voltage sensing is widely used, the cost and precision of it the capacitively-coupled sensors are closely related to the quality of the high voltage capacitors used to perform the measurements. High precision is often achieved by using closely matched foil capacitors immersed in a dielectric liquid or ceramic capacitors built with high-performance, temperature-compensating materials. These high precision capacitors generally are quite expensive.

A low cost approach is achieved by constructing a voltage-sensing capacitor as an integral part of the high voltage apparatus. The capacitance of such a capacitor is determined by the internal device geometry and the dielectric constant of an associated insulating material. The low cost approach often produces a relatively low capacitance value that limits the overall measurement accuracy of the design. Low capacitance, and therefore low energy, also presents a challenge in transmitting the measured information from the sensor to the device that is performing the voltage measurement.

Parasitic capacitance between the current transformer secondary winding and the high voltage conductor may elevate the potential of the secondary winding, which may lead to failure of the secondary winding insulation. A similar problem applies to the ferro-magnetic based transformer core if the potential is left freely floating with respect to the high voltage conductor potential. To reduce or eliminate this current transformer failure mechanism, the standard approach has been to ground the current transformer core or to add a grounded shielding electrode that protects the current transformer secondary winding.

SUMMARY

In one general aspect, improved precision for the measurement of the AC voltage applied to a primary high voltage conductor of a desired phase in a multi-phase system is achieved by using active electronic circuitry to compensate for crosstalk introduced by one or more additional phases in the multi-phase system. The voltage measurement may be based upon the use of a capacitive voltage sensor for each phase in the multi-phase system. A voltage measurement is obtained for the desired phase and for each additional phase in the multi-phase system. A product is generated for each additional phase by multiplying the additional phase voltage measurement by a corresponding predetermined constant. The product for each additional phase then is subtracted from the voltage measurement of the desired phase.

Implementations may include one or more of the following features. For example, in a three-phase system, there is a desired phase and two additional phases. A first product is generated for a first additional phase and a second product is generated for a second additional phase, and the products then are subtracted from the desired phase.

In another general aspect, improved precision for the measurement of the AC voltage applied to primary high voltage conductors of a multi-phase system such as a three-phase system is achieved by using active electronic circuitry to compensate for factors such as capacitive sensor gain, output impedance, and crosstalk limitations where the voltage measurements are based upon the use of a capacitive voltage sensor for each phase in the multi-phase system. A capacitive voltage divider having a first and second capacitance may be associated with each individual phase, with a drain resistor connected in parallel with the second capacitance for the associated phase. A high impedance amplifier, a programmable gain stage, a memory storage, a temperature compensating circuit, and a crosstalk cancellation circuit are used in connection with the capacitive voltage divider for each phase.

Implementations may include one or more of the following features. For example, in a three-phase system, outputs of three voltage sensors are amplified, corrections are made for gain and temperature variations, and the outputs are combined together to cancel the effects of mutual coupling between the three individual phases. A signal processing circuit is capable of amplifying and buffering the individual phase voltage sensor signals, adjusting the sensor output level, and producing an output capable of sending the measured signals to a remote control unit. In another example, a differential output driver and surge protection network are connected to assist in generating a balanced, surge-protected, low-impedance output which may be sent to a remote control unit. Also, a calibration port may be connected to the memory storage. In another example, a surge suppressor may be connected in parallel with the second capacitance of the capacitive voltage divider.

In another example, the crosstalk cancellation circuit may have an operational amplifier, a connecting resistor connected between the input and the output of the operational amplifier, a voltage input for the desired phase and each additional phase of the multi-phase system, and a resistor associated with each additional phase of the multi-phase system. In a three-phase system, for example, there would be a desired phase and two additional phases.

Other features and advantages will be apparent from the description and drawings, and from the claims.

DESCRIPTION OF DRAWINGS

Like reference symbols in the various drawings indicate like elements.

DETAILED DESCRIPTION

Figure 1:
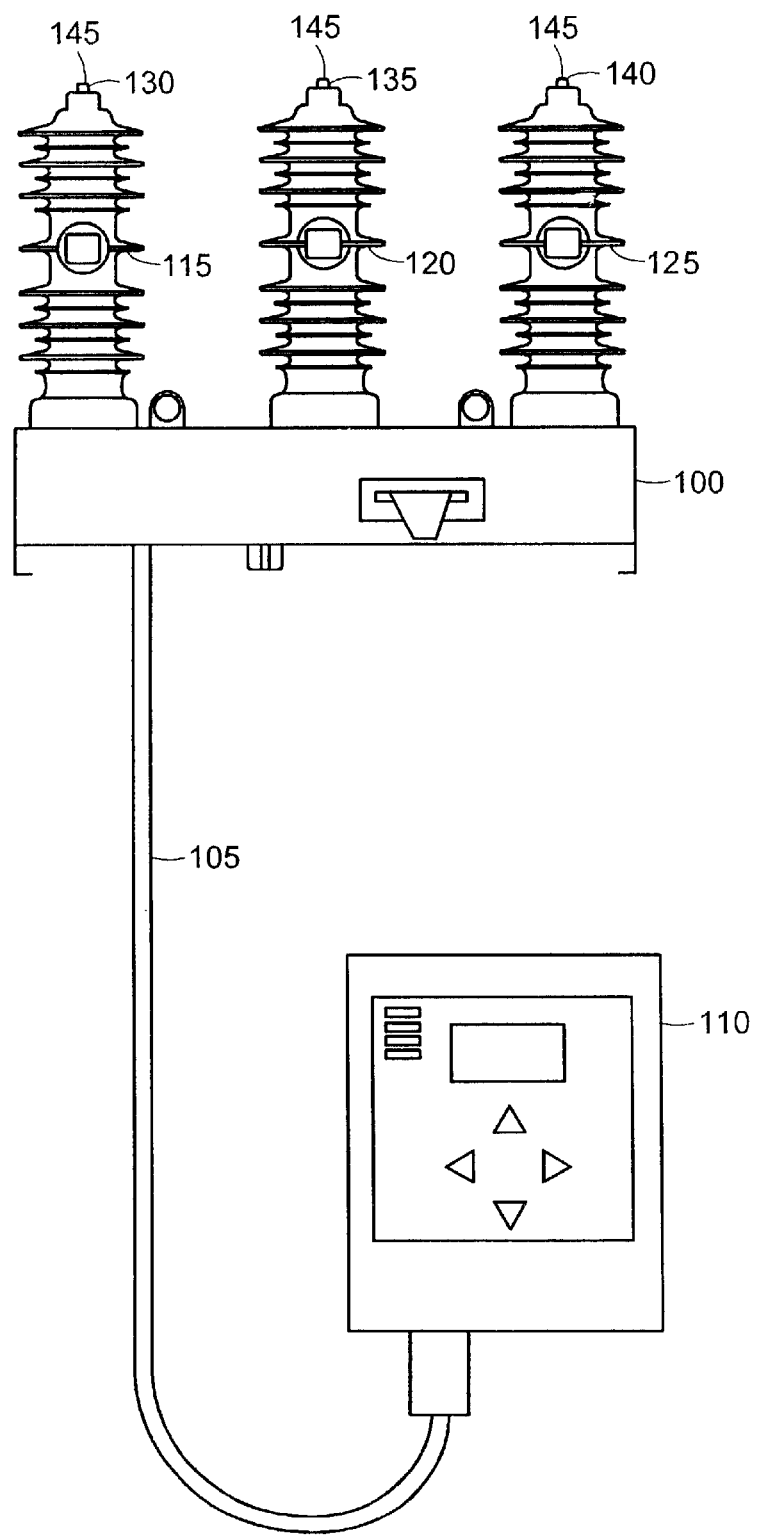
FIG. 1 is a front view of a three-phase auto-recloser system using a voltage sensor with active crosstalk cancellation.

FIG. 1 shows a three-phase auto-recloser 100 that is connected by a signal transmission cable 105 to an electronic control 110. High voltage conductors (not shown) are connected to terminals 115, 120, 125, 130, 135, and 140, extending from modules 145 of the auto-recloser 100.

Figure 2:
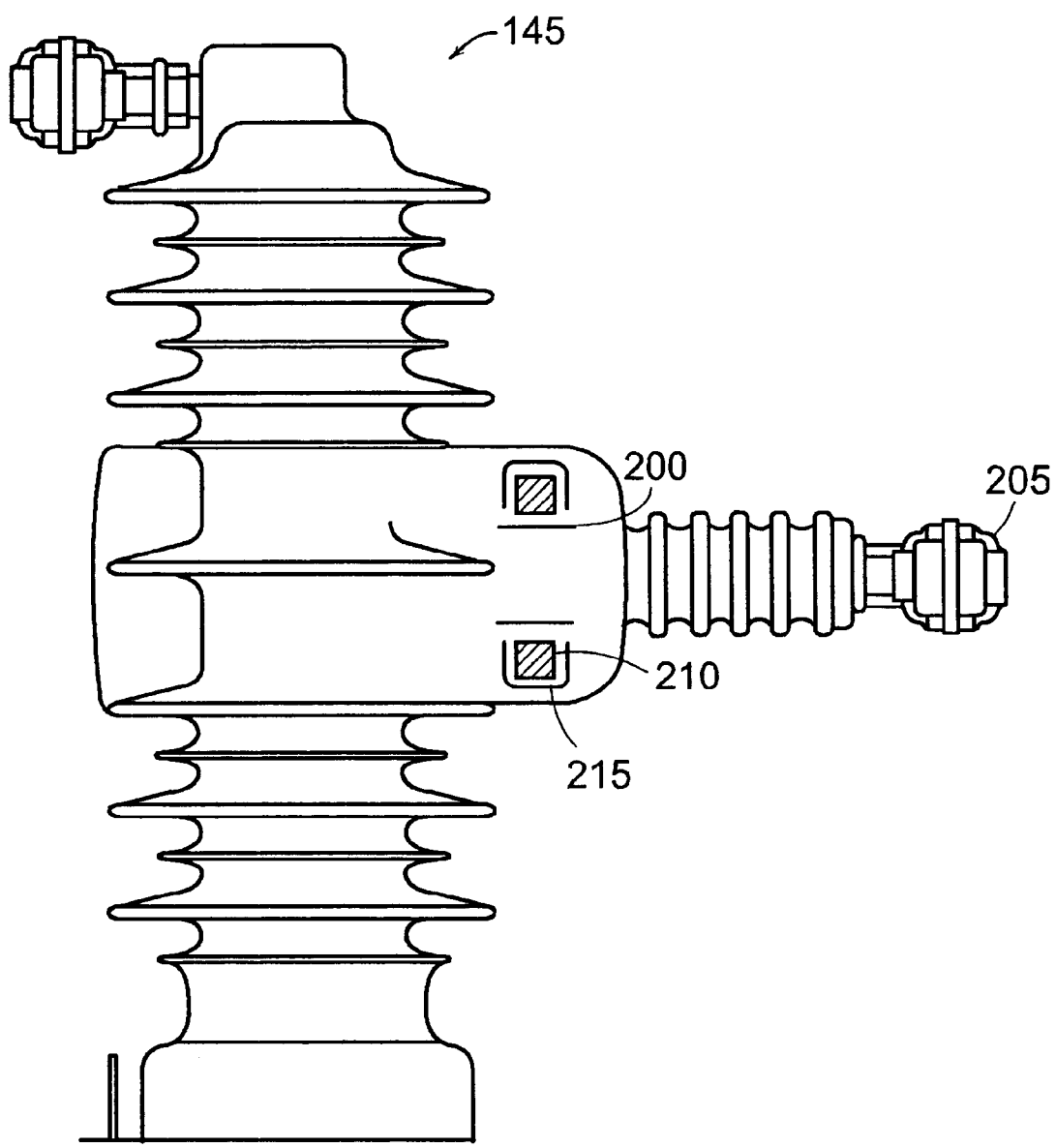
FIG. 2 is a partially cut-away side view showing the internal construction of a single module, including a voltage sensor, of the three-phase auto-recloser system shown in FIG. 1.

Referring to FIG. 2, each module 145 includes a capacitively-coupled voltage sensor 200 integrated around a side arm conductor 205 associated with a respective one of terminals 115, 120, and 125. The voltage sensing electrode 200 is axially symmetric about the high voltage conductor 205 and placed within the diameter of a current transformer 210. A current transformer corona shield 215 surrounds the current transformer and provides additional dielectric shielding for the voltage sensing electrode 200 to reduce external field effects. The combination of the capacitively-coupled voltage sensor and the current transformer is used to produce the voltage and current measurements.

Figure 3:
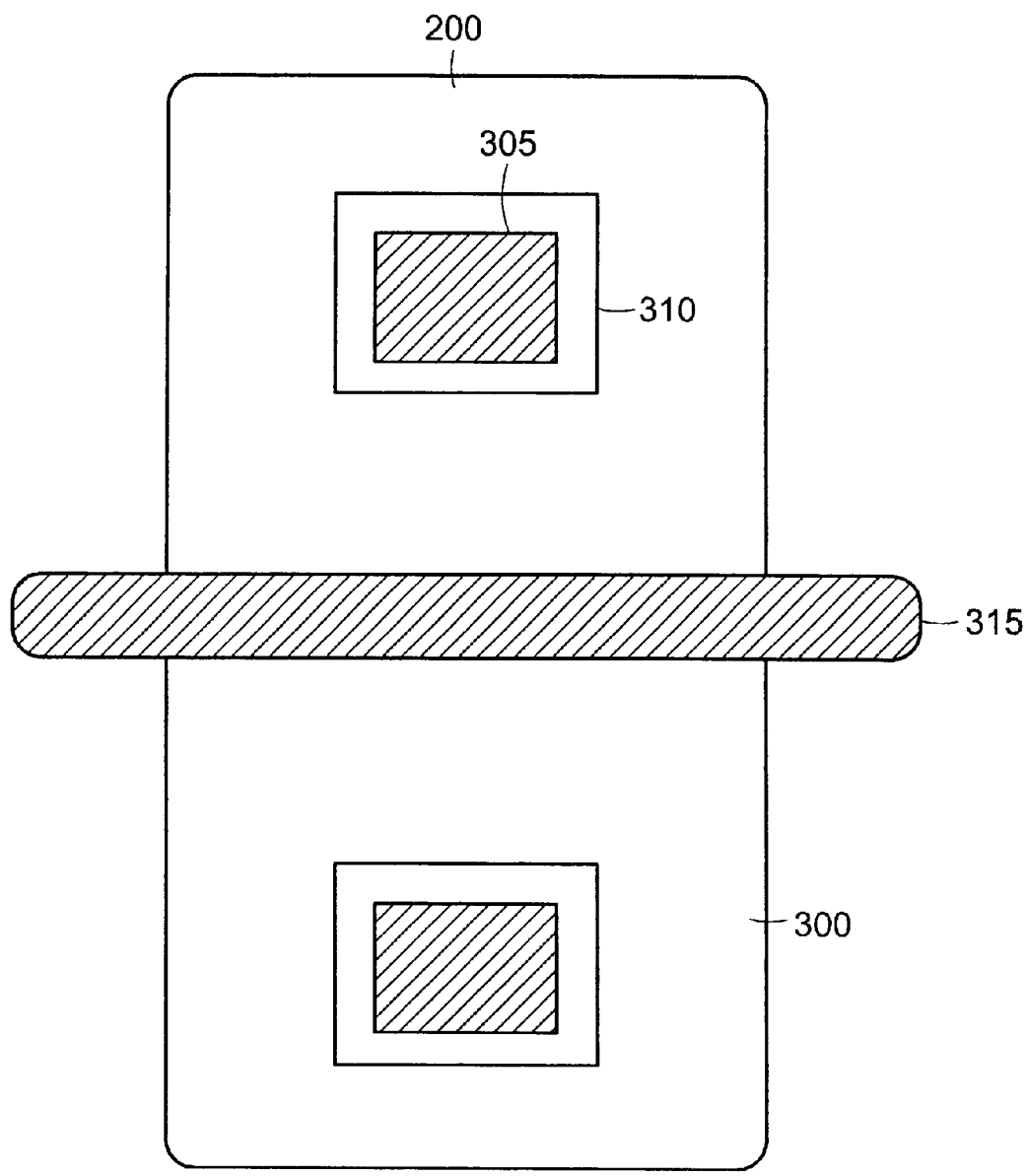
FIG. 3 is a cross-sectional side view of a combined current and voltage sensor.

As illustrated in FIG. 3, the combined current and voltage sensor 200 can be positioned within a solid insulating body 300 or immersed into an insulating gas or liquid. The sensor 200 includes a toroidal ferro-magnetic core 305 and an insulated secondary winding 310 that is wound uniformly around the core 305. The current carrying high voltage conductor 315 is centered and passes through the central core opening. FIG. 3 shows the combined current and voltage sensor 200 for a single phase. In a multi-phase power system network, a sensor 200 is needed for each individual phase.

Figure 4:
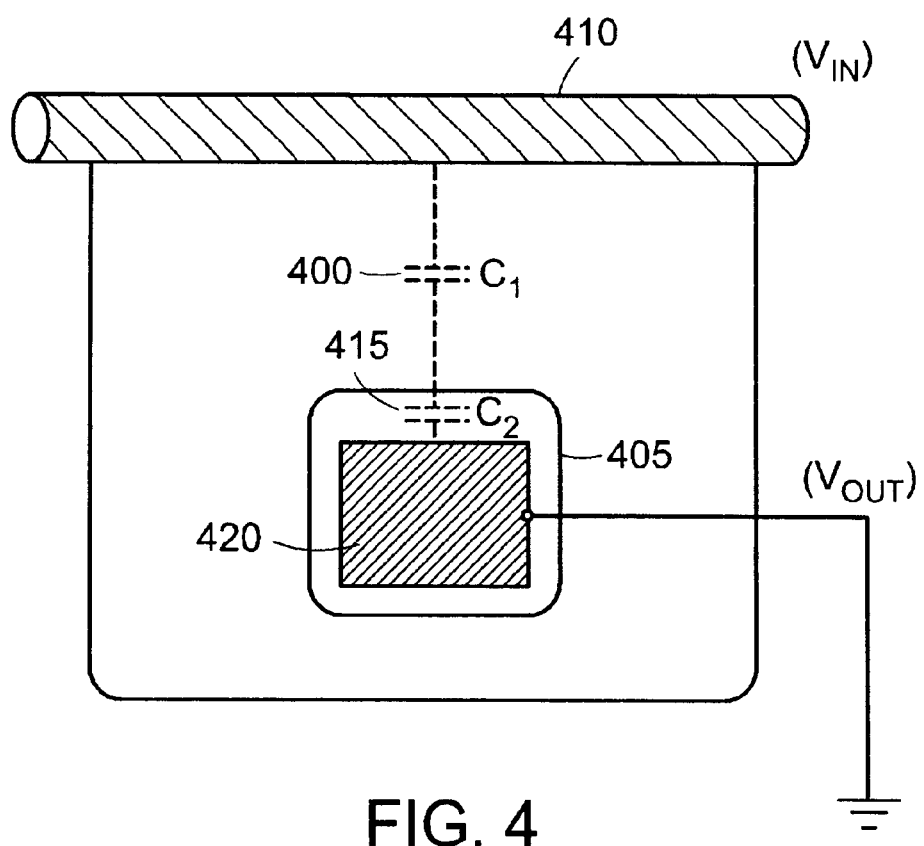
FIG. 4 a cross-sectional side view illustrating parasitic capacitance in the sensor of FIG. 3.

FIG. 4 shows the parasitic capacitance present in the combined current and voltage sensor system. Specifically, FIG. 4 shows the parasitic capacitance 400 present between the secondary winding 405 and the high voltage conductor 410. In addition, FIG. 4 shows the parasitic capacitance 415 present between the secondary winding 405 and the transformer core 420. The transformer core is typically connected to a reference potential, which may be electrical ground or another potential. Once transformer core 420 is grounded or placed at the reference potential, parasitic capacitances 400 and 415 form a simple capacitive divider. In this configuration, the secondary winding voltage will float at the output potential determined by the following equation:

$$V_{out} = V_{in} \times \frac{C_1}{C_1 + C_2}.$$

In the equation, $C_1$ is the parasitic capacitance 400 between the high voltage conductor and the secondary winding and $C_2$ is the parasitic capacitance 415 between the secondary winding and the transformer core.

The value of capacitor 400 is determined by the design of the current transformer. The output potential $V_{out}$ can be adjusted by increasing the value of the capacitance 415 so as to adjust the voltage divider ratio. The value of the capacitance 415 may be increased, for example, by adding an external capacitor between the current transformer secondary winding and the reference potential and/or by adjusting the value of the parasitic capacitance present between the secondary winding and the transformer core. The measured voltage and current signals are combined on a single pair of conductors (i.e., the current transformer secondary wires) and must be separated for actual measurement and display.

Figure 5:
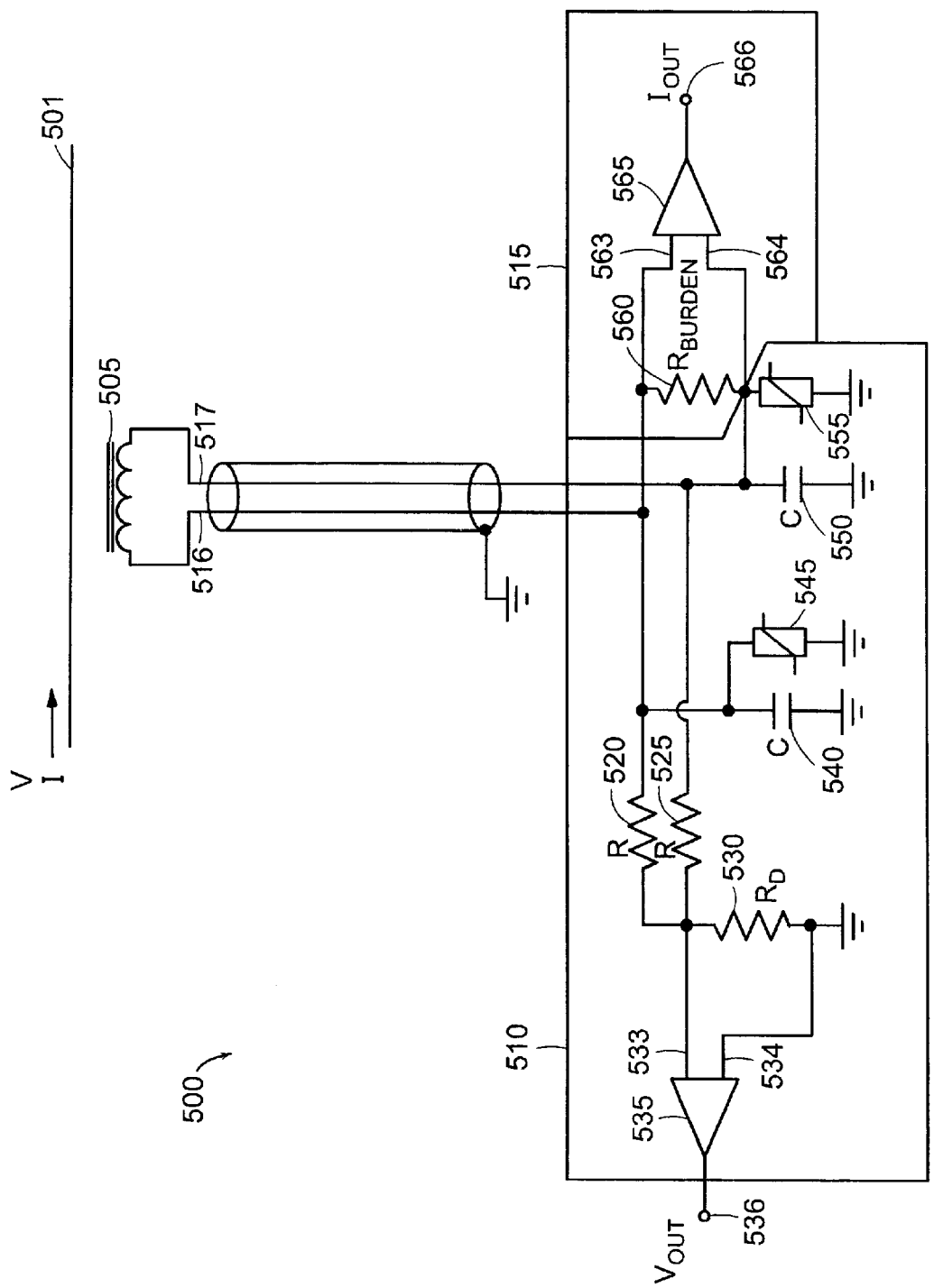
FIG. 5 is a block diagram of a current and voltage sensor for single-phase voltage.

FIG. 5 shows a circuit that separates the voltage and current signals using a differential amplifier in combination with a burden resistor. The output voltage level can be adjusted by varying the value of capacitance 415 (shown in FIG. 4) in current transformer 505. The value of the capacitance 415 may be increased, for example, by adding an external capacitor between the current transformer secondary winding and the reference potential and/or by adjusting the value of the parasitic capacitance present between the secondary winding and the transformer core. For example, the value of capacitors 540 and/or 550 may be varied. Under normal operating conditions, the output voltage $V_{out}$ typically is set between 0.5 and 10 $V_{RMS}$. Surge protection components may be introduced into the circuit to limit the maximum voltage that can be developed during power system transients, lightning strikes, and other over-voltage events. The surge suppressor protective level is normally coordinated at approximately 110% to 500% of the typical steady state operating level. Different surge suppressor technologies such as MOV, TVS, Sidactor, and Sparc-Gap may be used.

High voltage conductor 501 carries a current I and a voltage V, and is coupled to current transformer 505. Current transformer 505 is connected to a voltage measuring circuit 510 and a current measuring circuit 515.

The voltage measuring circuit 510 includes a capacitor 540 and a surge protection component 545 that are connected in parallel between a terminal 516 of current transformer 505 and ground. A resistor 520 is connected between a terminal 516 of current transformer 505 and an input 533 to an operational amplifier 535. The other input 534 to operational amplifier 535 is connected to ground. A capacitor 550 and a surge protection component 555 are connected in parallel between a terminal 517 of current transformer 505 and ground. A resistor 525 is connected between the terminal 517 of current transformer 505 and the input 533 to operational amplifier 535. A drain resistor 530 is connected between the input terminals 533 and 534 of operational amplifier 535. The output 536 of operational amplifier 535 is proportional to the voltage of high voltage conductor 501.

The current measuring circuit 515 includes a burden resistor 560 connected between terminal 516 and terminal 517 of current transformer 505. The burden resistor 560 is further connected between input terminals 563 and 564 of an operational amplifier 565. The output 566 of operational amplifier 565 is proportional to the current in high voltage conductor 501. In other implementations, the described operational amplifier and burden resistor combination are replaced with an auxiliary transformer.

Figure 6A:
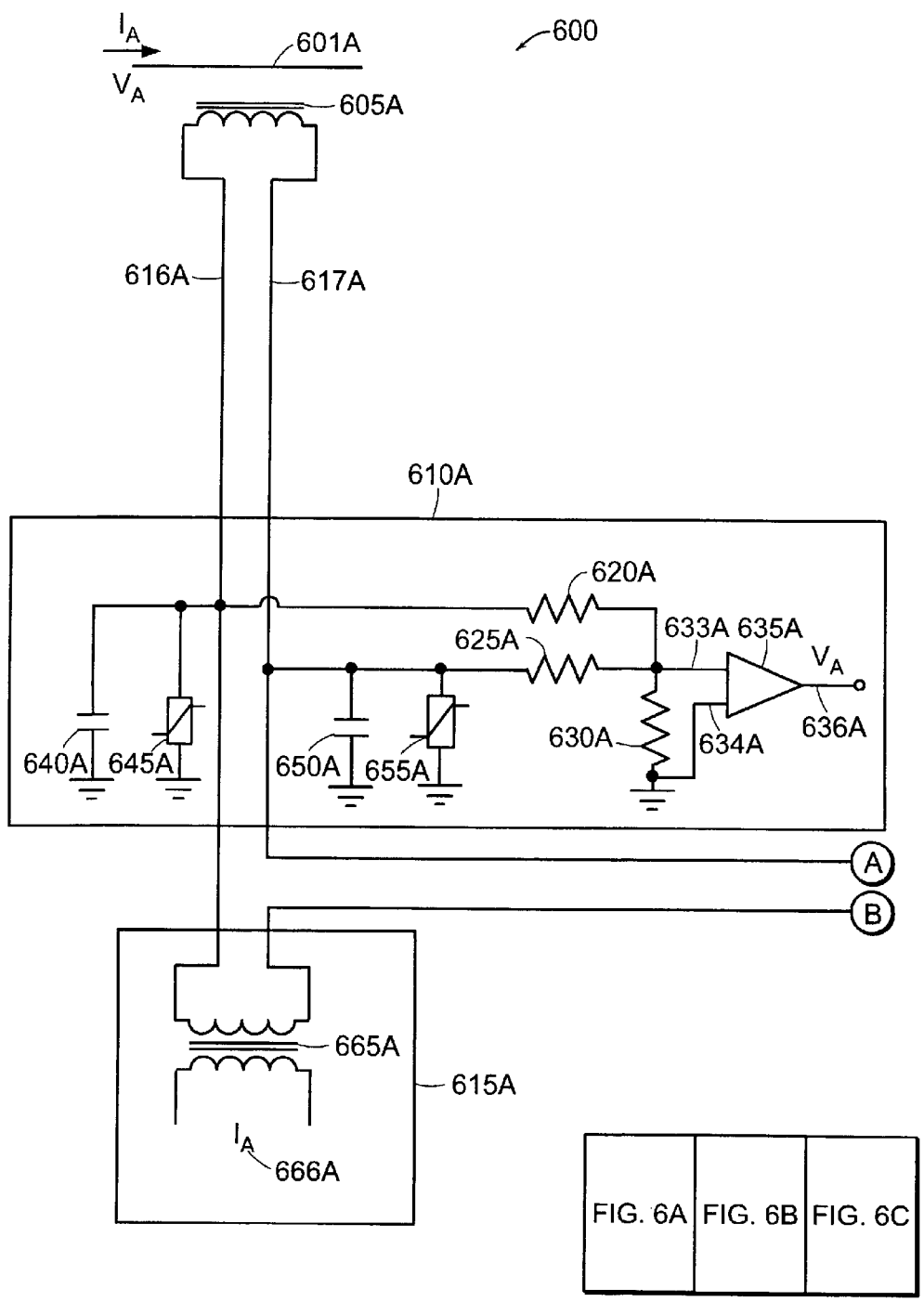
FIG. 6 is a block diagram of a current and voltage sensor for three-phase voltage.
Figure 6B:
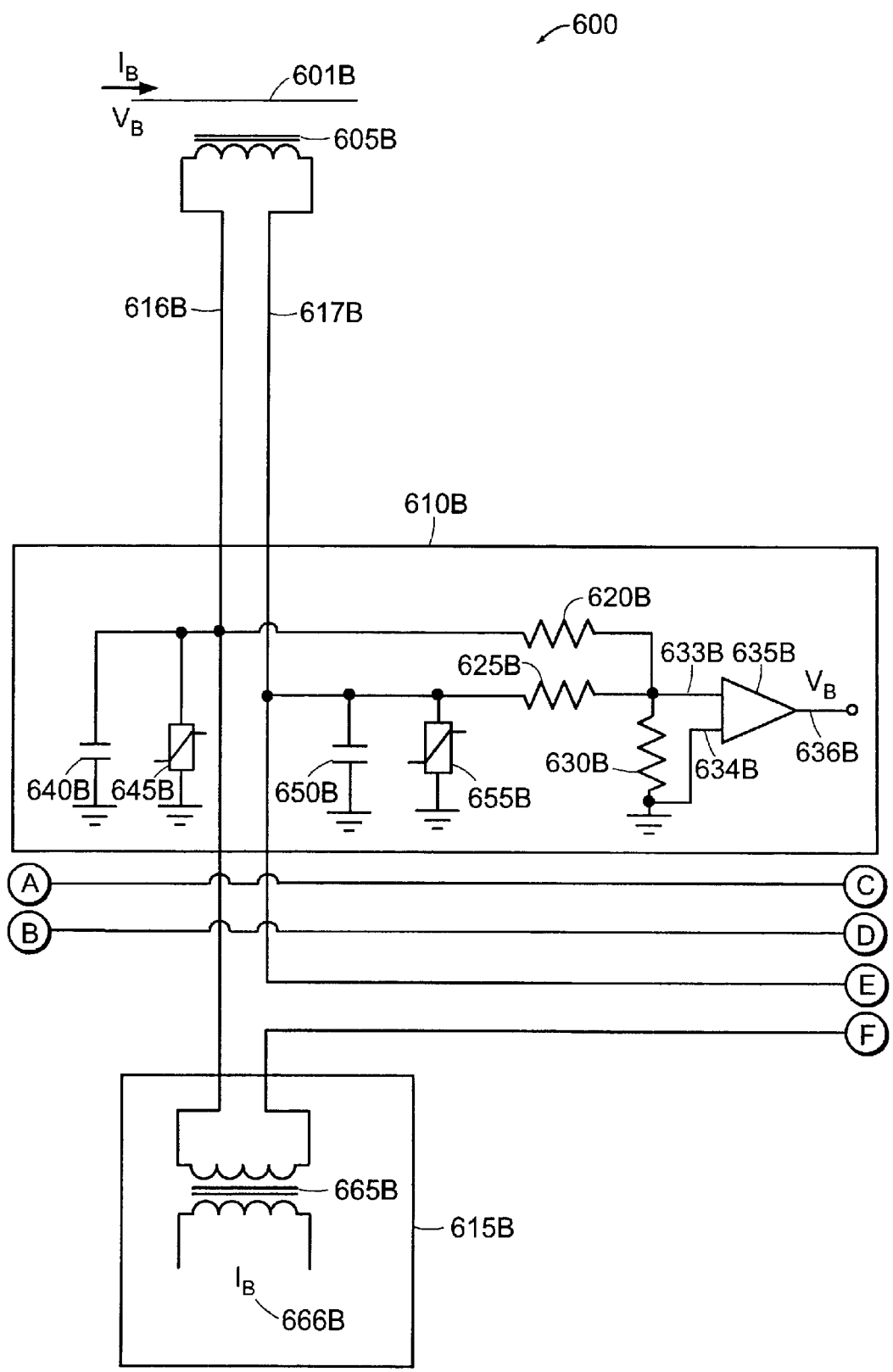
Figure 6C:
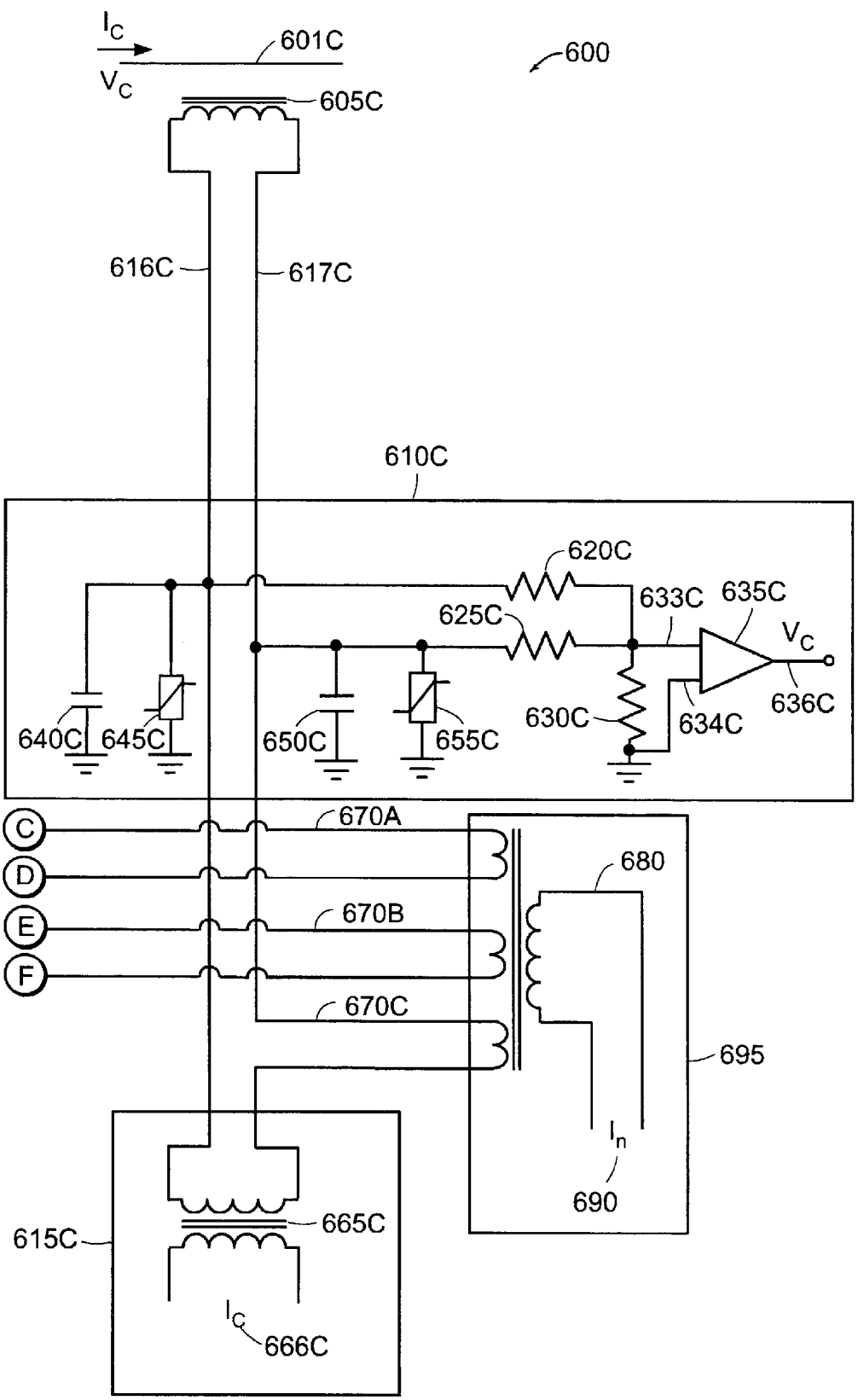

FIG. 6 shows a circuit 600 to extract the zero sequence (neutral) current 690 information in the case of a multi-phase power system network. This neutral current information is often necessary in a multi-phase power system network. The neutral current is extracted by summing together the three individual phase currents. The circuit also provides outputs for the individual phase voltages $636_A$, $636_B$, and $636_C$, and outputs for the individual phase currents $666_A$, $666_B$, and $666_C$.

High voltage conductors $601_A$, $601_B$, and $601_C$ carry currents $I_A$, $I_B$, and $I_C$ and voltages $V_A$, $V_B$, and $V_C$, and are coupled to current transformers $605_A$, $605_B$, and $605_C$ respectively. Each of current transformers $605_A$, $605_B$ and $605_C$ is connected to a corresponding one of voltage measuring circuits $610_A$, $610_B$, and 610c, and to a corresponding one of current measuring circuits $615_A$, $615_B$, and $615_C$. Current transformers $605_A$, $605_B$, and $605_C$ are further connected to neutral current measuring circuit 695.

For ease of description, components of the voltage measuring circuits $610_A$, $610_B$, and $610_C$ and the current measuring circuits $615_A$, $615_B$, and $615_C$ are referred to collectively rather than individually. Thus, for example, capacitors $640_A$, $640_B$, and $640_C$ are referred to as capacitor 640.

Each voltage measuring circuit 610 includes a capacitor 640 and a surge protection component 645 that are connected in parallel between a terminal 616 of current transformer 605 and ground. A resistor 620 is connected between a terminal 616 of current transformer 605 and an input 633 to an operational amplifier 635. The other input 634 to operational amplifier 635 is connected to ground. A capacitor 650 and a surge protection component 655 are connected in parallel between a terminal 617 of current transformer 605 and ground. A resistor 625 is connected between a terminal 617 of current transformer 605 and an input 633 to operational amplifier 635. A drain resistor 630 is connected between the input terminals 633 and 634 of operational amplifier 635. The output 636 of operational amplifier 635 is proportional to the voltage of the corresponding high voltage conductor 601.

Each of the current measuring circuits 615 includes an auxiliary transformer 665 connected between terminal 616 and terminal 617 of current transformer 605. The output 666 of auxiliary transformer 665 is proportional to the current in the corresponding high voltage conductor 601. In other implementations, an operational amplifier and burden resistor combination may be substituted for the described auxiliary transformer 665.

The neutral current measuring circuit 695 includes windings $670_A$, $670_B$, and $670_C$ of an auxiliary transformer 680. These windings are connected between auxiliary transformer $665_A$, $665_B$, and $665_C$ and current transformer $605_A$, $605_B$, and $605_C$. The neutral current output 690 sensed by transformer 680 is proportional to the sum of the three phase currents $I_A$, $I_B$, and $I_C$.

Figures 7, 7A:
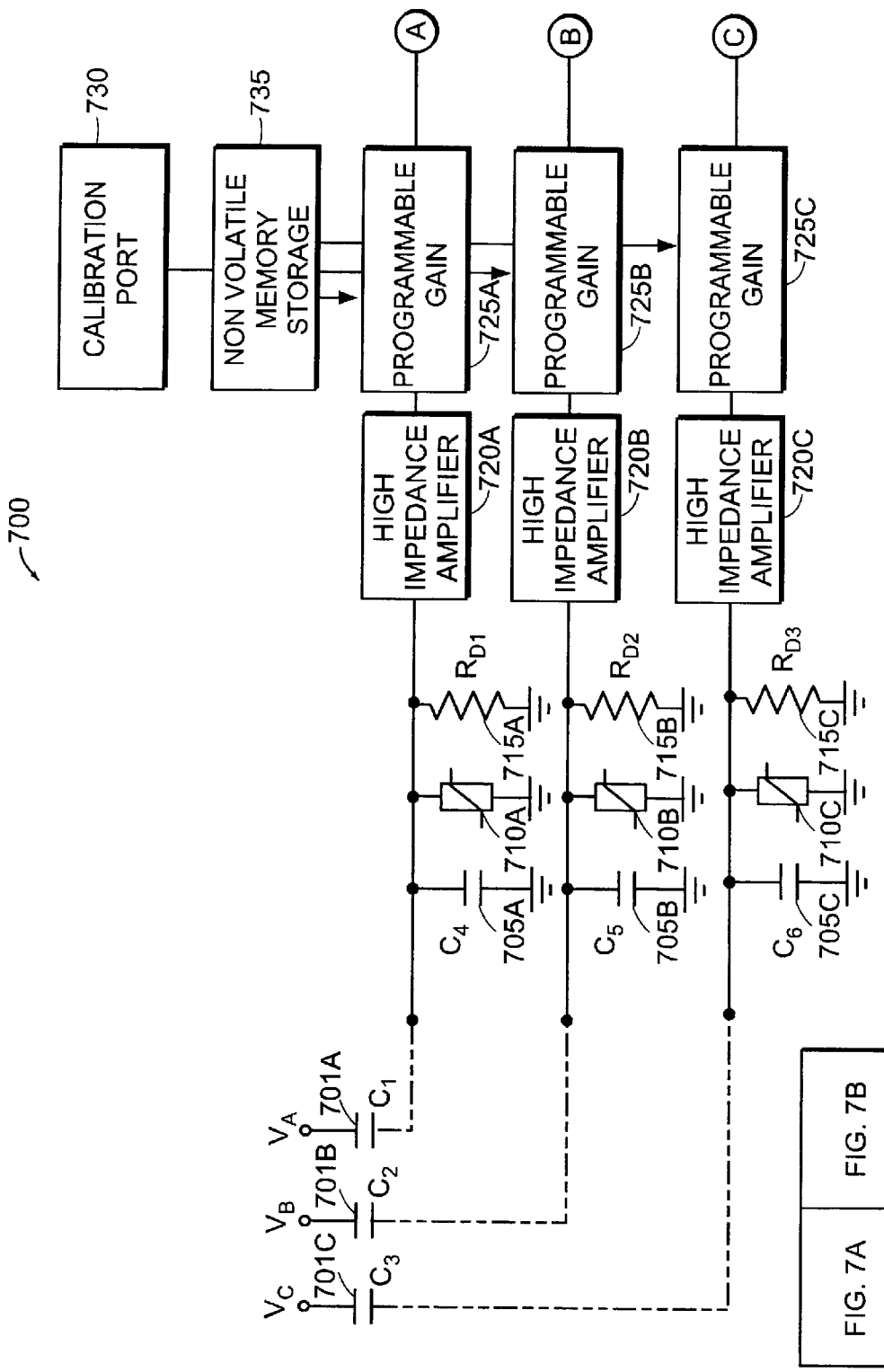
FIG. 7 is a block diagram of a voltage sensor and crosstalk cancellation system used by the system of FIG. 1.
Figure 7B:
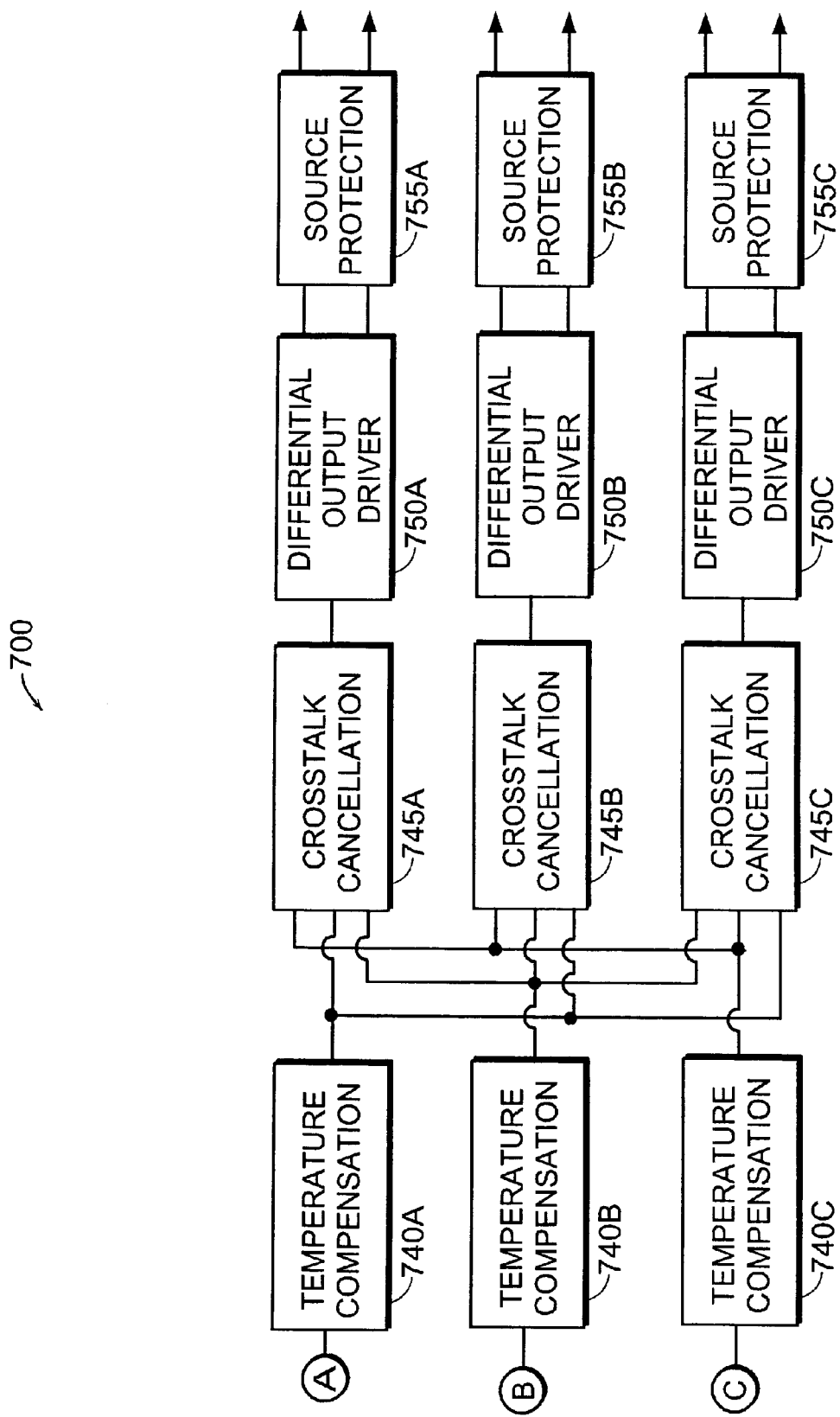

Referring to FIG. 7, each of phases $V_A$, $V_B$, and $V_C$ of the three-phase AC voltage is measured by an associated one of the high-voltage capacitive sensors $701_A$, $701_B$, and $701_C$. The outputs of the three high voltage capacitor sensors $701_A$, $701_B$, and $701_C$ are combined by a signal processing circuit 700 located within a housing of the auto-recloser 100 (FIG. 1). The signal processing circuit 700 includes load capacitors $705_A$, $705_B$, and $705_C$, which are used to form simple capacitive voltage dividers in combination with the high voltage capacitors $701_A$, $701_B$, and $701_C$. The output of each of the voltage dividers is connected to a corresponding one of surge protection networks $710_A$, $710_B$, and $710_C$ and drain resistors $715_A$, $715_B$, and $715_C$. The drain resistors are used to eliminate any static charge which may be present on the outputs of the voltage dividers.

The signals then are passed to high impedance buffer circuits $720_A$, $720_B$, and $720_C$ which are used to minimize the voltage sensor phase error. From the buffer circuits, the signals pass through programmable gain stages $725_A$, $725_B$, and $725_C$ to account for manufacturing tolerances of the high voltage capacitors $701_A$, $701_B$, and $701_C$. The programmable gain stages correct the individual sensor ratio so that the divider ratios are the same for each phase of the three-phase AC voltage. The required gain calibration parameters for the programmable gain stages can be programmed by using a calibration port 730 and are stored in non-volatile memory 735.

The calibrated individual sensor outputs are fed through temperature compensation circuits $740_A$, $740_B$, and $740_C$, which use ambient temperature measurements to compensate for the temperature variations of the individual capacitive voltage dividers. The value required for temperature compensation is determined by the type of dielectric used in capacitors 701 and 705, and is constant in any given sensor design.

Next, the individual sensor outputs are fed through crosstalk compensation circuits $745_A$, $745_B$, and $745_C$ to provide first order crosstalk cancellation. Alternatively, higher orders of crosstalk cancellation may be provided. The crosstalk cancellation may be performed by signal processing hardware, and may be implemented, for example, as an application-specific integrated circuit (ASIC). Alternatively, the crosstalk cancellation may be performed by a computer program running on either a general purpose computer or a special purpose computer. Crosstalk cancellation minimizes the effect of crosstalk between the three voltage sensors. The crosstalk is caused by the simple high voltage capacitor construction and the relative proximity of the three-phase voltage conductors.

In the presence of crosstalk, the measured voltage present on the output of the individual voltage sensors can be described by the following equation (1):

$$V_A^{measured} = V_A + k_1 V_B + k_2 V_C$$

$$V_B^{measured} = V_B + k_3 V_A + k_4 V_C$$

$$V_C^{measured} = V_C + k_5 V_A + k_6 V_B \quad (1)$$

The system of equations in (1) is a system of three equations with three unknowns, namely $V_A$, $V_B$, and $V_C$. These unknowns, $V_A$, $V_B$, and $V_C$, are the voltages to be measured. The system of equations above describes a linear superposition caused by the proximity of the three sensors to each other and the imperfect shielding of the individual sensors from crosstalk. The three sensors for phases A, B, and C are used to measure three voltages, $V_A^{measured}$, $V_B^{measured}$, and $V_C^{measured}$. The measured voltage of each phase contains crosstalk terms from the other two phases. For example, the measured voltage $V_A^{measured}$ contains the term $k_1 V_B$ from phase B and the term $k_2 V_C$ from phase C. In equation (1), the coupling constants $k_1$, $k_2$, $k_3$, $k_4$, $k_5$, and $k_6$ are determined by the auto-recloser device geometry. The coupling constants can be measured and will remain constant as long as the device geometry is kept constant. For the symmetric three-phase design shown in FIG. 1, the coupling constants are symmetric ($k_1 = k_3 = k_4 = k_6$ and $k_2 = k_5$). The full solution of the system of equations in (1) is shown below in equation (2).

$$V_A = \frac{V_A^{MEAS} - k_4 k_6 V_A^{MEAS} - k_1 V_B^{MEAS} + k_2 k_6 V_B^{MEAS} - k_2 V_C^{MEAS} + k_1 k_4 V_C^{MEAS}}{1 - k_1 k_3 - k_2 k_5 - k_4 k_6 + k_1 k_4 k_5 + k_2 k_3 k_6} \quad (2)$$

-continued $$V_B = \frac{-k_3 V_A^{MEAS} + k_4 k_5 V_A^{MEAS} + V_B^{MEAS} - k_2 k_5 V_B^{MEAS} - k_4 V_C^{MEAS} + k_2 k_3 V_C^{MEAS}}{1 - k_1 k_3 - k_2 k_5 - k_4 k_6 + k_1 k_4 k_5 + k_2 k_3 k_6}$$

$$V_C = \frac{-k_5 V_A^{MEAS} + k_3 k_6 V_A^{MEAS} - k_6 V_B^{MEAS} + k_1 k_5 V_B^{MEAS} + V_C^{MEAS} - k_1 k_3 V_C^{MEAS}}{1 - k_1 k_3 - k_2 k_5 - k_4 k_6 + k_1 k_4 k_5 + k_2 k_3 k_6}$$

Equation (2) can be simplified when the crosstalk levels (as indicated by coefficients $k_1$, $k_2$, $k_2$, $k_3$, $k_4$, $k_5$, and $k_6$) are sufficiently low. For example, when the crosstalk levels are equal to or less than approximately 0.1 (10%), the set of equations in (2) may be simplified so that the corrected output values are described by the following equation (3):

$$V_A^{corrected} = V_A^{measured} - K_1 V_B^{measured} - k_2 V_C^{measured}$$

$$V_B^{corrected} = V_B^{measured} - k_3 V_A^{measured} - k_4 V_C^{measured}$$

$$V_C^{corrected} = V_C^{measured} - k_5 V_A^{measured} - k_6 V_B^{measured} \quad (3)$$

Equation (3) is derived from equation (2) as follows. First, consider the denominator of equation (2). The denominator can be approximated as the value of 1 when the crosstalk levels are sufficiently low, for example 0.1 or less. The second term in the denominator of equation (2) is equal to or less than 0.01 if the coefficients $k_1$ and $k_3$ are equal to or less than 0.1 because $k_1 k_3 > 0.1 * 0.1 = 0.01$. The same analysis applies to the third term, $k_2 k_5$, and the fourth term, $k_4 k_6$. Therefore, the second, third, and fourth term each contribute 1% error or less. The fifth and sixth terms are even smaller. The fifth term is equal to or less than 0.001 if the coefficients $k_1$, $k_4$, and $k_5$ are equal to or less than 0.1 because $k_1 k_4 k_5 \leq 0.1 * 0.1 * 0.1 = 0.001$. The same analysis applies to the sixth term, $k_2 k_3 k_6$. Therefore, the fifth and sixth terms each contribute 0.1% error or less. When $k_1$, $k_2$, $k_3$, $k_4$, $k_5$, and $k_6$ are equal to or less than 0.1, the denominator becomes $1 - 0.01 - 0.01 - 0.01 + 0.001 + 0.001 = 0.972$, which is almost equal to 1.00. Thus, for crosstalk terms approximately equal to or less than 0.1, the denominator effectively reduces to 1.

The numerator can be simplified in a similar fashion. When the crosstalk levels are sufficiently low, for example 0.1 or less, the second, fourth, and sixth terms in the numerator are small contributors which can be eliminated. For example, in the second term of the first equation in (2), the factor $k_4 k_6 \leq 0.1 * 0.1 = 0.01$. Eliminating the small contributors in the numerator of equation (2) results in the simplified first order crosstalk cancellation of equation (3).

Equation (3), as simplified from equation (2), only satisfies the first order crosstalk cancellation because the measured terms already contain errors introduced by adjacent sensors in the other phases. However, it is appropriate to use equation (3) in certain cases, such as an analog circuit implementation with crosstalk levels (as indicated by coefficients $k_1$, $k_2$, $k_3$, $k_4$ $k_5$, and $k_6$) approximately equal to or less than 0.1 (10%).

Because the values in equation (3) contain second order errors due to the simplification from equation (2), the resulting voltages at the left hand side of equation (2) are not called $V_A$, $V_B$, and $V_C$. Instead, the terms $V_A^{corrected}$, $V_B^{corrected}$ and $V_C^{corrected}$ are used to capture this difference between equations (2) and (3).

As previously mentioned, the crosstalk cancellation described above may be performed by signal processing hardware, and may be implemented, for example, as an application-specific integrated circuit (ASIC). Alternatively, the crosstalk cancellation may be performed by a computer program running on either a general purpose computer or a special purpose computer.

After crosstalk cancellation is performed, the sensor output for each of phases $V_A$, $V_B$, and $V_C$ of the three-phase AC voltage is fed to a corresponding one of differential output drivers $750_A$, $750_B$, and $750_C$. The output drivers 750 amplify the measurement signals for each phase $V_A$, $V_B$, and $V_C$ of the three-phase AC voltage and make them ready for transmission through a cable. Differential outputs are used to enhance the immunity of the transmitted signal to externally induced noise. Finally, the sensor outputs are fed to surge protection networks $755_A$, $755_B$, and $755_C$ for transmission on the cable 105.

Figure 8:
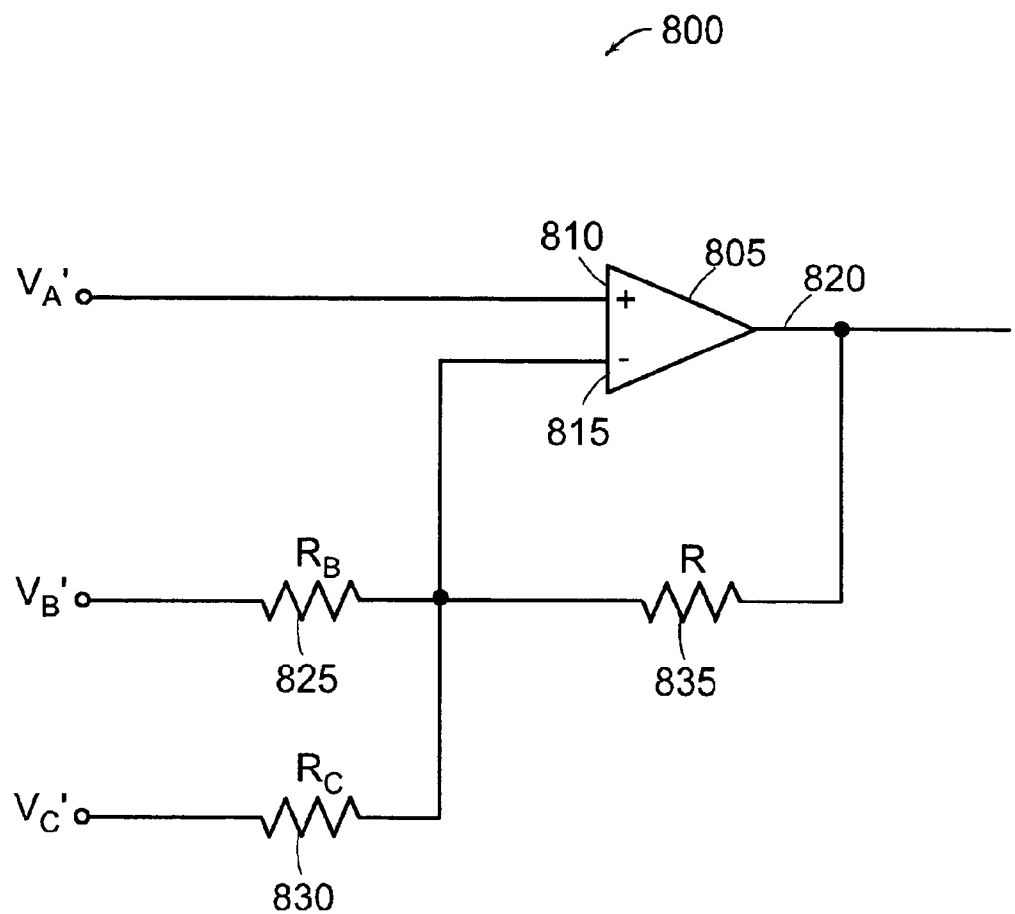
FIG. 8 is a schematic diagram of an electronic circuit for performing crosstalk cancellation used by the cancellation system of FIG. 7.

Referring to FIG. 8, a circuit 800 for economically performing the crosstalk cancellation function is shown for a single phase, in this case phase "A," of the three-phase system. The inputs $V_A$, $V_B$, and $V_C$ shown in FIG. 8 may be obtained, for example, from outputs $636_A$, $636_B$, and $636_C$ of FIG. 6. The inputs $V_A$, $V_B$, and $V_C$ shown in FIG. 8 are proportional to the voltages of high voltage conductors as shown, for example, by $601_A$, $601_B$, and $601_C$ of FIG. 6.

Input $V_A$ is connected to the positive input 810 of an operational amplifier 805. A resistor 825 is connected between input VB and the negative input 815 of operational amplifier 805. A resistor 830 is connected between input $V_C$ and the negative input 815 of operational amplifier 805. Resistor 835 is connected between the negative input 815 and the output 820 of operational amplifier 805. The output 820 of operational amplifier 805 represents the first order crosstalk cancellation of the errors introduced by phases B and C into the measurement of phase A, as shown in equation (2) above. The same approach just described for one phase applies equally to the other two phases.

It will be understood that various modifications may be made. For example, the crosstalk compensating function can be performed in software on a programmable numeric device. Such an implementation is also an attractive way to apply the full solution to a simple system of linear equations shown in equation (3), so as to eliminate higher order errors a introduced by equation (2).

As another example, in FIG. 5 the differential amplifier/burden resistor combination may be substituted with an auxiliary current transform. Also, in FIG. 5, a single capacitor and/or resistor with center tapped auxiliary current transformer. It is also possible to eliminate resistor R.

Accordingly, other implementations are within the scope of the following claims.

What is claimed is:

1. An apparatus for active crosstalk cancellation in a multi-phase system, the apparatus comprising:
   a capacitive voltage divider associated with each individual phase of the multi-phase system, each capacitive voltage divider comprising a first capacitance between a high voltage conductor for the associated phase and a junction point, and a second capacitance between the junction point and ground;
   a drain resistor associated with each individual phase, each drain resistor connected in parallel with the second capacitance for the associated phase;

a programmable gain stage associated with each individual phase, each programmable gain stage connected to the junction point for the associated phase;

a memory storage connected to each of the programmable gain stages; and a crosstalk cancellation circuit associated with each individual phase, each crosstalk cancellation circuit connected to each of the programmable gain stages for the multi-phase system.

2. The apparatus of claim 1 further comprising:

a differential output driver associated with each individual phase, each differential output driver connected to the crosstalk cancellation circuit for the associated phase; and a surge protection network associated with each individual phase, each surge protection network connected to the differential output driver for the associated phase.

3. The apparatus of claim 1, further comprising a surge suppressor associated with each individual phase, each surge suppressor connected in parallel with the second capacitance for the associated phase.

4. The apparatus of claim 1 further comprising a calibration port connected to the memory storage.

5. The apparatus of claim 1 wherein the multi-phase system comprises three phases.

6. The apparatus of claim 1 further comprising:

a high impedance amplifier associated with each individual phase, each high impedance amplifier being connected between the junction point for the associated phase and the programmable gain stage for the associated phase; and a temperature compensating circuit associated with each individual phase, each temperature compensating circuit being connected between the programmable gain stage for the associated phase and each of the crosstalk cancellation circuits for the multi-phase system.

7. The apparatus of claim 1 in which the crosstalk cancellation circuit performs a first order crosstalk cancellation of crosstalk induced by one or more additional phases from a voltage measurement of a desired phase of the multi-phase system.

8. The apparatus of claim 7 wherein each crosstalk cancellation circuit comprises:

an operational amplifier including a first input terminal, a second input terminal, and an output terminal;

a voltage input associated with the associated phase of the multi-phase system connected to the first input terminal of the operational amplifier;

a resistor associated with each additional phase of the multi-phase system connected between a voltage input for the associated additional phase and the second input terminal of the operational amplifier; and a connecting resistor connected between the second input terminal of the operational amplifier and the output of the operational amplifier.

9. The apparatus of claim 8 wherein the multi-phase system comprises three phases, such that there are two additional phases.

10. The apparatus of claim 9 wherein:

the voltage input associated with an individual phase of the multi-phase system further comprises a voltage input associated with a first phase; and the resistor associated with each additional phase further comprises:

a first resistor associated with a second phase connected between a voltage input for the second phase and the second input terminal of the operational amplifier; and a second resistor associated with a third phase connected between a voltage input for the third phase and the second input terminal of the operational amplifier.

11. An apparatus for active crosstalk cancellation in a multi-phase system, the apparatus comprising:

a capacitive voltage divider associated with each individual phase of a multi-phase system, each capacitive voltage divider comprising a first capacitance between the high voltage conductor for the associated phase and a second capacitance between the first capacitance and ground;

a drain resistor associated with each individual phase, each drain resistor connected in parallel with the second capacitance for the associated phase;

means for programmable gain associated with each individual phase, each means for programmable gain using the junction of the first and second capacitance;

means for memory storage using each programmable gain means; and means associated with each individual phase for crosstalk cancellation using each means for programmable gain.

12. The apparatus of claim 11 further comprising:

means associated with each individual phase for differential output driving using the means for crosstalk cancellation; and means associated with each individual phase for surge protection using the means for differential output driving.

13. The apparatus of claim 11 further comprising:

means associated with each individual phase for surge suppression using the second capacitance for the associated phase.

14. The apparatus of claim 11, wherein the multi-phase system comprises three phases.

15. The apparatus of claim 11 further comprising:

means associated with each individual phase for high impedance amplification using the junction of the first and second capacitance, wherein each means for programmable gain comprises means for programmable gain using the means for high impedance amplification; and means associated with each individual phase for temperature compensation using the means for programmable gain.

16. The apparatus of claim 11 in which the means for crosstalk cancellation comprises means for performing a first order crosstalk cancellation of crosstalk induced by one or more additional phases from a voltage measurement of a desired phase of the multi-phase system.

* * * * *